(12) United States Patent
Chang (10) Patent No.: US 7,677,962 B2
(45) Date of Patent: Mar. 16, 2010

(54) ELECTRONIC DEVICE AND FILTERING UNIT

(76) Inventor: Chong-Min Chang, 2F., No. 6, Lane 45, Sec. 2, Jhihnan Rd., Wunshan District, Taipei City (TW) 116

( * ) Notice: Subject to any disclaimer, the term of this patent is extended or adjusted under 35 U.S.C. 154(b) by 0 days.

(21) Appl. No.: 11/680,998

(22) Filed: Mar. 1, 2007

(65) Prior Publication Data
US 2007/0207721 A1    Sep. 6, 2007

(30) Foreign Application Priority Data
Mar. 1, 2006    (TW)    ............... 95106784 A (51) Int. Cl.
 H05K 5/00    (2006.01)
 G03B 21/16    (2006.01)
 B01D 50/00    (2006.01)
 G06F 1/20    (2006.01)
(52) U.S. Cl. .................. 454/184; 353/57; 55/385.2; 361/679.48
(58) Field of Classification Search ................ 454/184; 353/57; 55/385.2; 361/679.48
See application file for complete search history.

(56) References Cited

U.S. PATENT DOCUMENTS

| | | | | |
|---|---|---|---|---|
| 2,065,970 A | * | 12/1936 | Hartzell | ............. 55/473 |
| 5,219,464 A | * | 6/1993 | Yamaga et al. | ............. 96/402 |
| 5,679,137 A | * | 10/1997 | Erdman et al. | ............. 96/26 |
| 6,344,074 B1 | * | 2/2002 | Ward et al. | ............. 96/399 |
| 6,544,309 B1 | * | 4/2003 | Hoefer et al. | ............. 55/283 |
| 6,656,253 B2 | * | 12/2003 | Willey et al. | ............. 96/27 |
| 6,885,554 B1 | * | 4/2005 | Reeck et al. | ............. 361/695 |
| 2004/0227837 A1 | * | 11/2004 | Ito | ............. 348/335 |
| 2005/0081495 A1 | * | 4/2005 | Wei et al. | ............. 55/290 |
| 2005/0108996 A1 | * | 5/2005 | Latham et al. | ............. 55/385.2 |
| 2005/0134806 A1 | * | 6/2005 | Hsieh | ............. 353/57 |
| 2005/0242013 A1 | * | 11/2005 | Hunter et al. | ............. 210/143 |

FOREIGN PATENT DOCUMENTS

JP    08201917 A    *    8/1996

\* cited by examiner

*Primary Examiner*—Steven B McCallister
*Assistant Examiner*—Patrick F. O'Reilly, III
(74) *Attorney, Agent, or Firm*—Perkins Coie LLP (57) ABSTRACT

A filtering unit for receiving an electronic device. The filtering unit includes a housing, a filter, a fan, a detector, and a controller. The housing includes an inlet. The filter is disposed at the inlet of the housing. The fan is disposed in the housing. The detector detects the number of particles in the filter. The controller is coupled to the fan and the detector. When the number of the particles in the filter exceeds a threshold value, the detector outputs a signal to the controller to change the rotating direction of the fan.

25 Claims, 7 Drawing Sheets

ELECTRONIC DEVICE AND FILTERING UNIT

BACKGROUND OF THE INVENTION

1. Field of the Invention

The present invention relates to an electronic device and a filtering unit, and in particular, to a filtering unit with a mechanism to assist in the cleaning of its filter.

2. Description of the Related Art

Electronic devices, such as projectors, generate heat during operation, air convection is necessary for cooling. Fine particles, such as dust in the air, may be, however, sucked into the electronic device, thus causing damage. As a result, a filtering unit for filtering fine particles is necessary.

Figure 1:
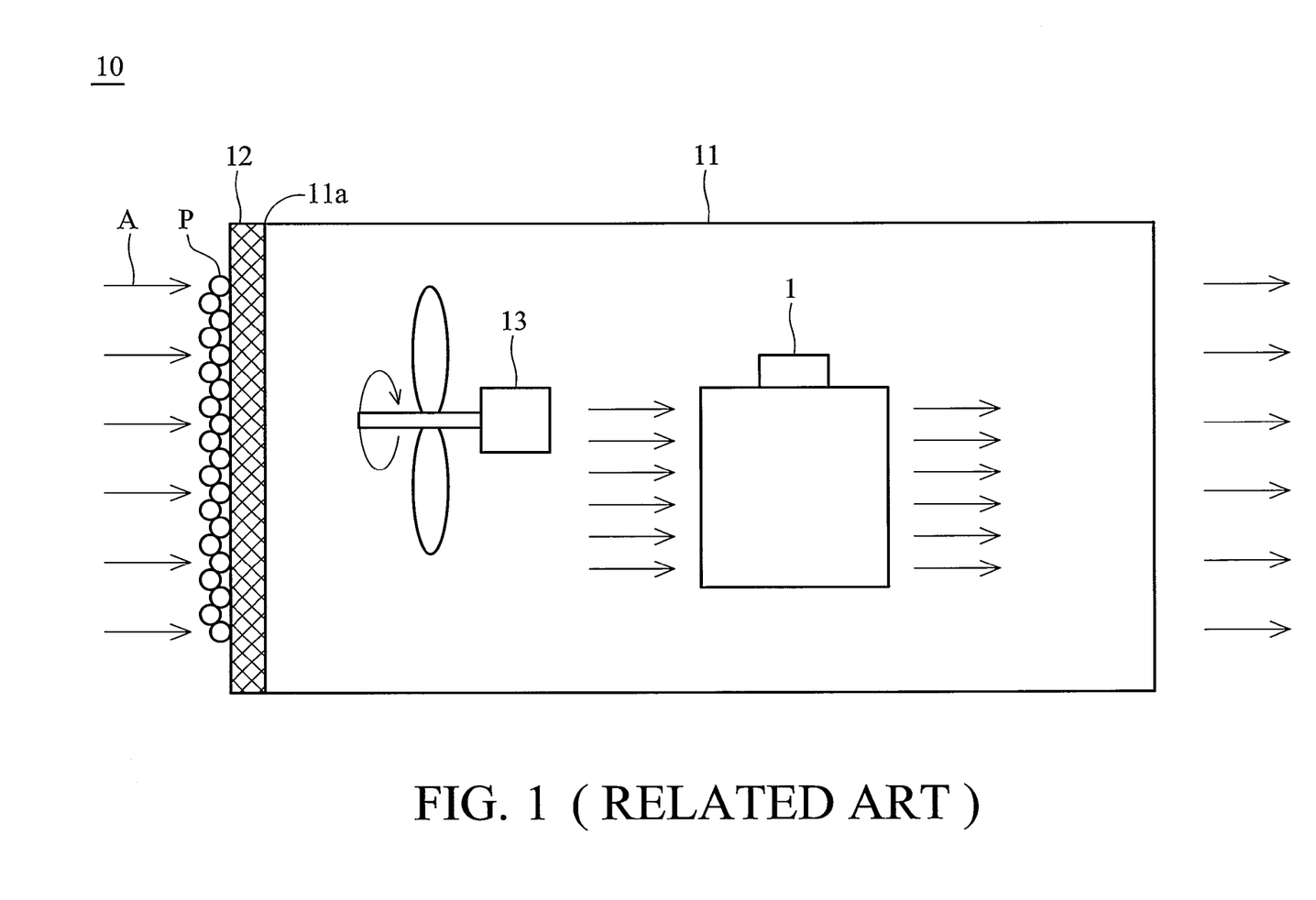
FIG. 1 is a schematic view of a conventional filtering unit.

FIG. 1 is a schematic view of a conventional filtering unit 10. A filter 12 is disposed at an inlet 11a of a housing 11. A fan 13 and a device 1 to be cooled are disposed in the housing 11. The fan 13 draws the air A into the housing 11, and the filter 12 filters particles P in the air A. Since the filter 12 may be obstructed by the particles P, it must be replaced at predetermined intervals to maintain normal air convection.

BRIEF SUMMARY OF THE INVENTION

Filtering units are provided. An exemplary embodiment of a filtering unit receives an electronic device therein, and comprises a housing, a first filter, a first fan, a first detector, and a controller. The housing comprises an inlet. The first filter is disposed at the inlet of the housing. The first fan is disposed in the housing. The first detector detects the number of particles in the first filter. The controller is coupled to the first fan and the first detector. When the number of the particles in the first filter exceeds a threshold value, the first detector outputs a signal to the controller to change the rotating direction of the first fan.

The first filter comprises a first side and a second side. The first detector comprises a light emitter and a receiver. The light emitter is disposed adjacent to the first side of the first filter to emit light. The receiver is disposed adjacent to the second side of the first filter to receive the light from the light emitter. The light emitter may be a light emitting diode, and the receiver may be an optical switch Alternatively, the first detector comprises a light emitter, a reflector, and a receiver. The light emitter is disposed adjacent to the first side of the first filter to emit light. The reflector is disposed adjacent to the second side of the first filter. The light is emitted onto the reflector. The receiver is disposed adjacent to the first side of the first filter to receive the light from the reflector.

Furthermore, the filtering unit comprises a vibrator disposed on the first filter to be coupled to the controller. When the number of the particles in the first filter exceeds the threshold value, the controller actuates the vibrator to remove the particles in the first filter. Alternatively, the filtering unit further comprises a rotating member coupled to the controller. When the number of the particles in the first filter exceeds the threshold value, the controller actuates the rotating member to rotate and strike the first filter to remove the particles in the first filter.

Moreover, the housing further comprises an exit. The filtering unit further comprises a second filter, a second fan, and a second detector. The second filter is disposed at the exit of the housing. The second fan is disposed in the housing and coupled to the controller. The second detector is coupled to the controller, and detects the number of the particles in the second filter. When the number of the particles in the second filter exceeds the threshold value, the second detector outputs a signal to the controller to stop the first fan and the second fan. The first fan and the first detector are disposed around the first filter, and the second fan and the second detector are disposed around the second filter.

Another exemplary embodiment of a filtering unit receives an electronic device therein, and comprises a housing, a filter, a cleaning device, a detector, and a controller. The housing comprises an inlet. The filter is disposed at the inlet of the housing. The cleaning device is disposed at the housing. The detector detects the number of particles in the filter. The controller is coupled to the cleaning device and the detector. When the number of the particles in the filter exceeds a threshold value, the detector outputs a signal to the controller to actuate the cleaning device to remove the particles from the filter.

Electronic devices are provided. An exemplary embodiment of an electronic device comprises a housing, a filter, a fan, a detector, and a circuit board. The housing comprises an inlet. The filter is disposed at the inlet of the housing. The fan is disposed in the housing. The detector detects the number of particles in the filter. The circuit board is disposed in the housing, and comprises a controller coupled to the fan and the detector. When the number of the particles in the filter exceeds a threshold value, the detector outputs a signal to the controller to change the rotating direction of the fan.

Another exemplary embodiment of an electronic device comprises a housing, a filter, a cleaning device, a detector, and a circuit board. The housing comprises an inlet. The filter is disposed at the inlet of the housing. The cleaning device is disposed at the housing. The detector detects the number of particles in the filter. The circuit board is disposed in the housing, and comprises a controller coupled to the cleaning device and the detector. When the number of the particles in the filter exceeds a threshold value, the detector outputs a signal to the controller to actuate the cleaning device to remove the particles from the filter.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein:

FIG. 3a is a schematic view of an embodiment of a first detector in FIG. 2a;

FIG. 3b is a schematic view of another embodiment of a first detector in FIG. 2a;

DETAILED DESCRIPTION OF THE INVENTION

Figure 2A:
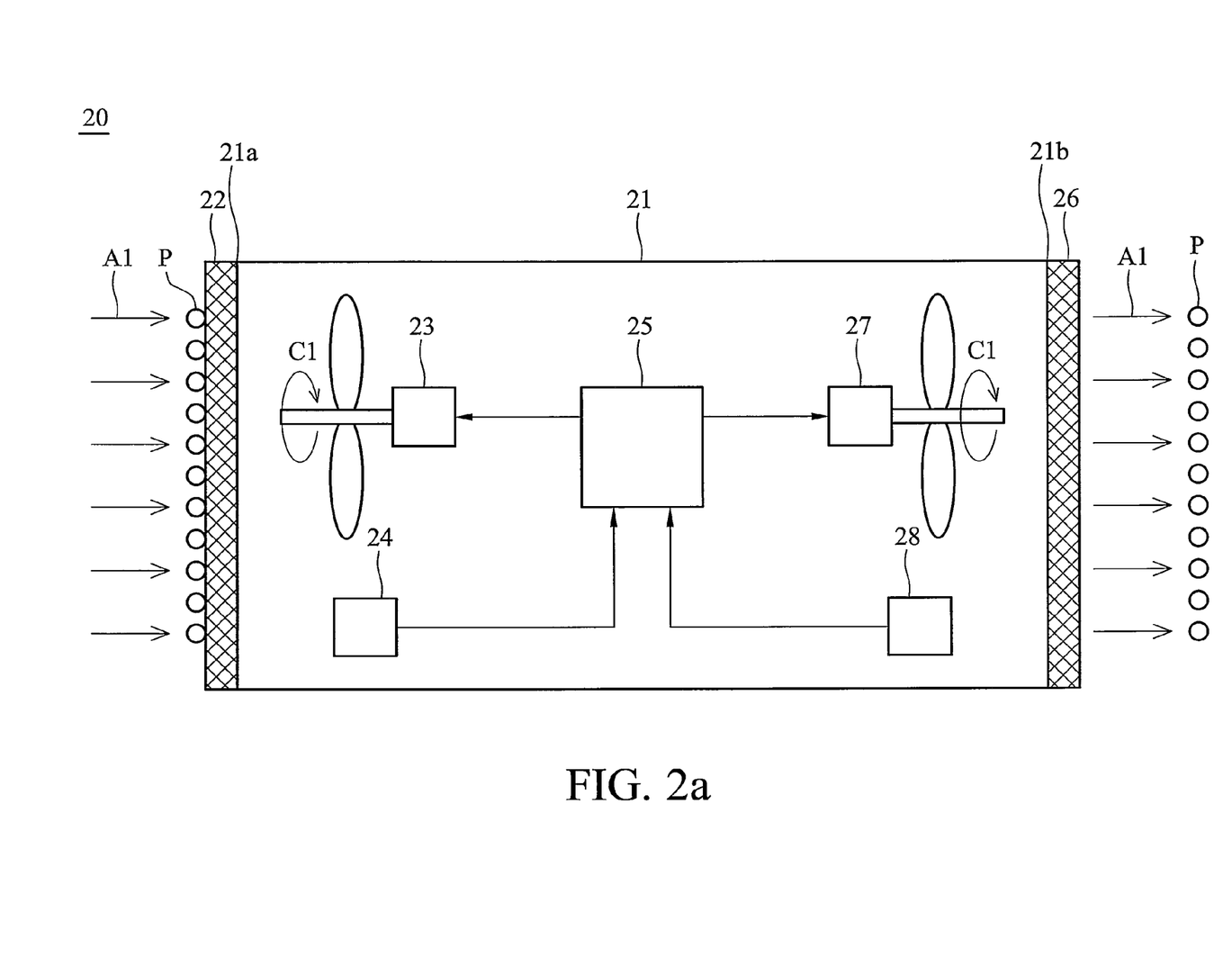
FIGS. 2a and 2b are schematic views of an embodiment of a filtering unit of this invention.

Referring to FIG. 2a, an embodiment of a filtering unit 20 of the invention receives an electronic device (not shown) therein, and comprises a housing 21, a first filter 22, a first fan 23, a first detector 24, a controller 25, a second filter 26, a second fan 27, and a second detector 28. The housing 21 comprises an inlet 21a and an exit 21b. The first filter 22 is disposed at the inlet 21a of the housing 21, and the second filter 26 is disposed at the exit 21b of the housing 21 to filter particles P in the air. The first fan 23 and the second fan 27 are disposed in the housing 21 to generate airflow.

Figure 3A:
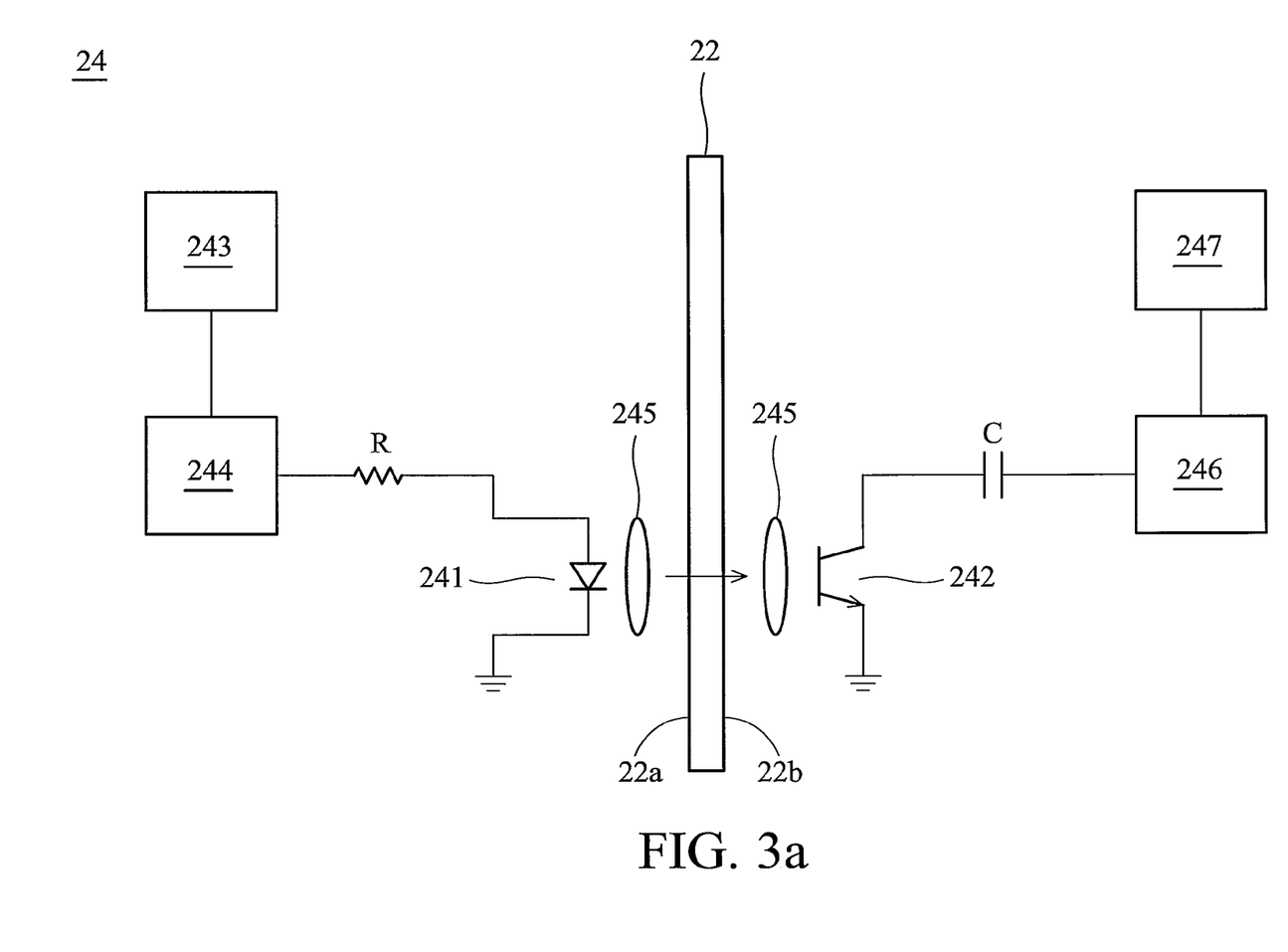
Figure 3B:
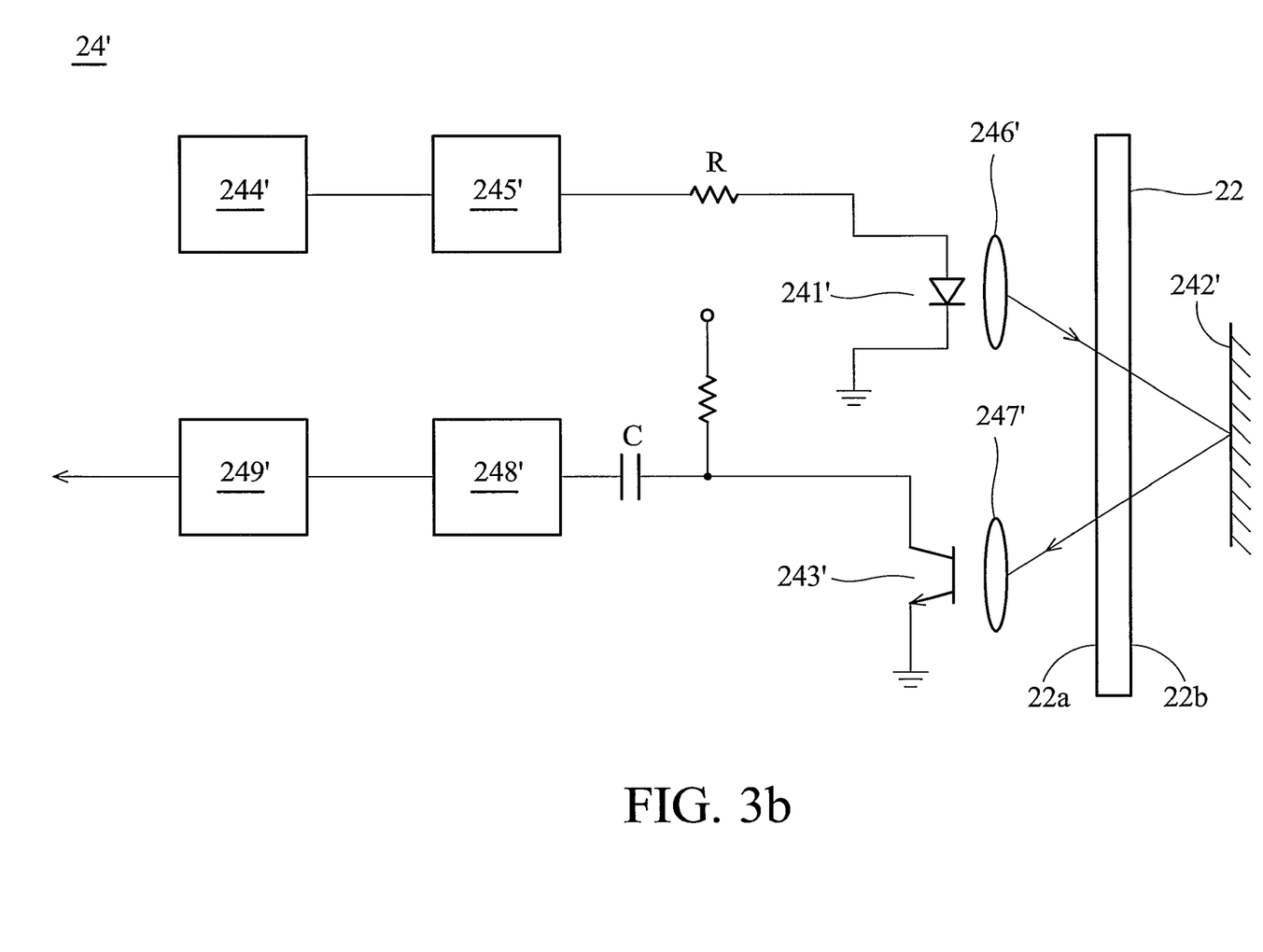

The first detector 24 detects the number of the particles P in the first filter 22. Referring to FIGS. 3a and 3b, the first detector 24 may be transparent-type or reflective-type. FIG. 3a depicts a transparent-type detector comprising a light emitter 241 and a receiver 242. The light emitter 241 is disposed adjacent to a first side 22a of the first filter 22 to emit light. The receiver 242 is disposed adjacent to a second side 22b of the first filter 22 to receive the light from the light emitter 241. The light emitter 241 may be a light emitting diode, and the receiver 242 may be an optical switch. Furthermore, the first detector 24 comprises an oscillatory circuit 243, a current amplifier 244, two lenses 245, a band-pass filter 246, and a rectifier 247. Since these elements 243-247 are well known, their detailed description is omitted.

FIG. 3b depicts a reflective-type detector 24' comprising a light emitter 241', a reflector 242', and a receiver 243'. The light emitter 241' is disposed adjacent to the first side 22a of the first filter 22 to emit light onto the reflector 242'. The reflector 242' is disposed adjacent to the second side 22b of the first filter 22. The receiver 243' is disposed adjacent to the first side 22a of the first filter 22 to receive the light reflected from the reflector 242'. The light emitter 241' may be a light emitting diode, and the receiver 243' may be an optical switch. Furthermore, the first detector 24' comprises an oscillatory circuit 244', a current amplifier 245', two lenses 246' and 247', a band-pass filter 248', and a rectifier 249'. Since these elements 244'-249' are well known, their detailed description is omitted.

The second detector 28 detects the number of the particles P in the second filter 26. Because the construction and manner of disposing the second detector 28 are similar to those of the first detector 24, their detailed description is omitted.

Note that the first fan 23 and the first detector 24 are disposed around the first filter 22, and the second fan 27 and the second detector 28 are disposed around the second filter 26.

The controller 25 is coupled to the first fan 23, the first detector 24, the second fan 27, and the second detector 28. The controller 25 receives detected values from the first and second detectors 24 and 28. When the number of the particles P in the first filter 22 exceeds a threshold value, the first detector 24 outputs a signal to the controller 25 to change the rotating direction of the first and second fans 23 and 27. When the number of the particles P in the second filter 26 exceeds the threshold value, the second detector 28 outputs a signal to the controller 25 to stop the first fan 23 and the second fan 27.

Figure 2B:
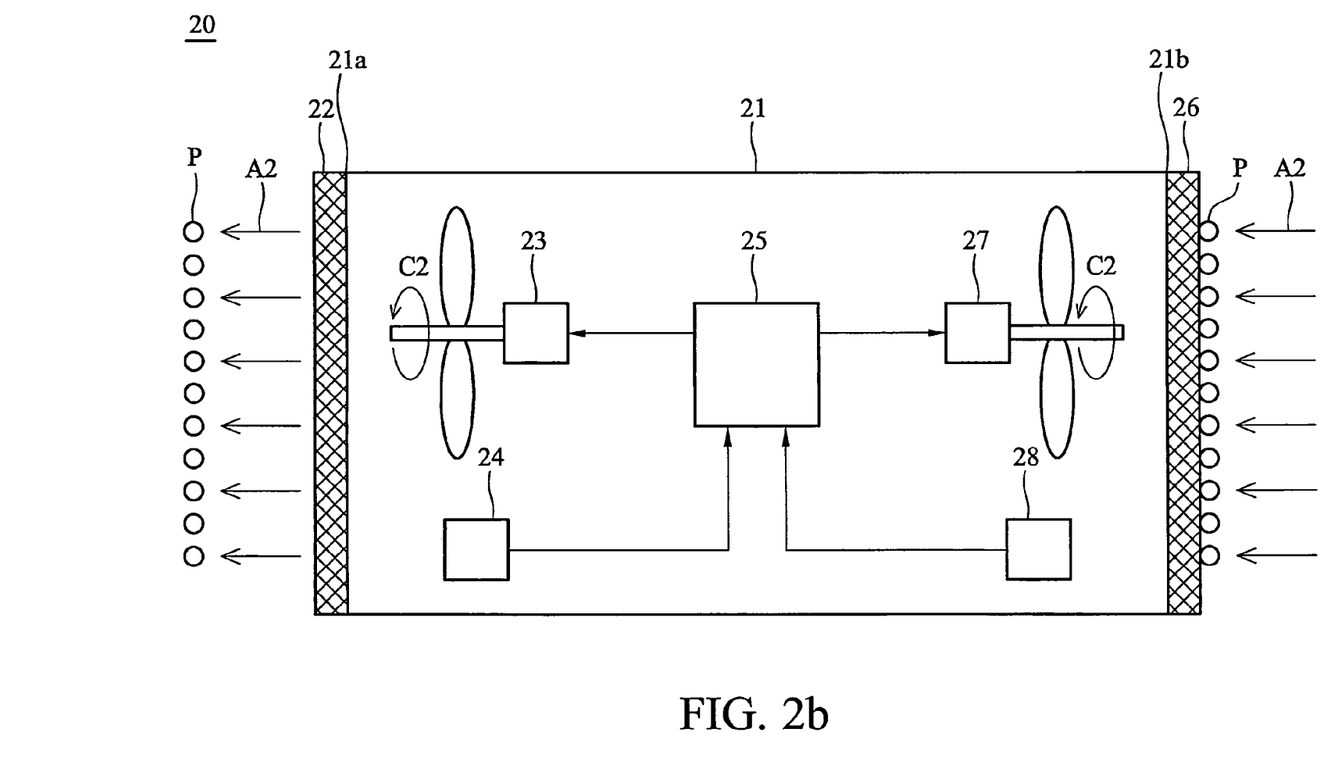

Specifically, after a predetermined period, the particles P are accumulated in the first filter 22. When the first detector 24 detects that the number of the particles P in the first filter 22 exceeds the threshold value, the first detector 24 outputs the signal to the controller 25. At this time, the controller 25 changes the rotating direction of the first and second fans 23 and 27 from a direction C1 as shown in FIG. 2a to a direction C2 as shown in FIG. 2b. Thus, the airflow is changed from a direction A1 as shown in FIG. 2a to a direction A2 as shown in FIG. 2b. Since the airflow direction is reversed, the particles P in the first filter 22 may be removed, thus obtaining the self-cleaning function.

The second detector 28 is an auxiliary element. Specifically, if the exit 21b of the filtering unit 20 is located in an environment with poor air quality, the particles P may be drawn into the filtering unit 20 when the airflow direction is A2 as shown in FIG. 2b. Thus, when the number of the particles P in the second filter 26 exceeds the threshold value, the second detector 28 outputs the signal to the controller 25 to stop the first fan 23 and the second fan 27, thus preventing the air in the filtering unit 20 from deteriorating.

Figure 4A:
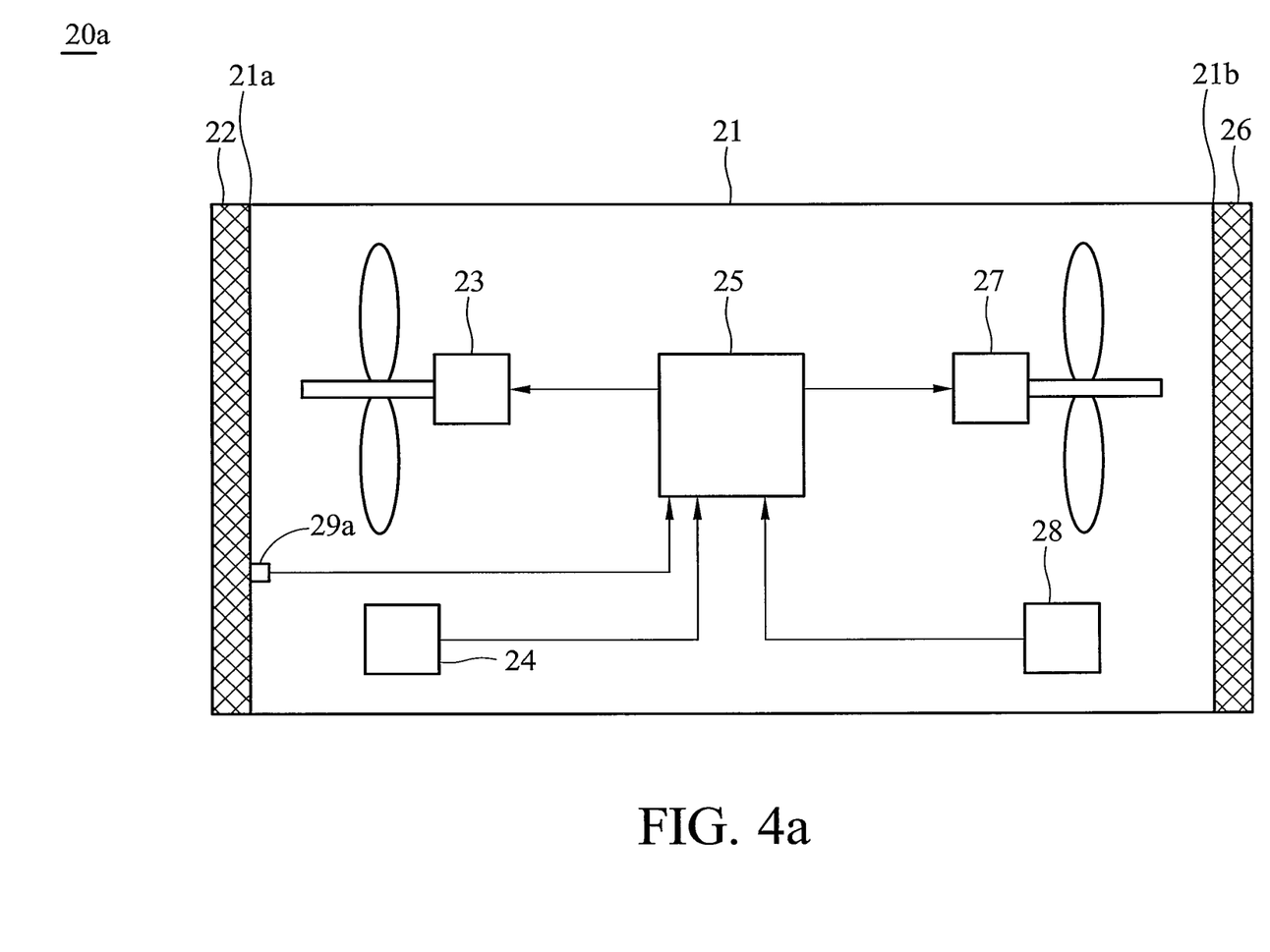
FIG. 4a is a schematic view of another embodiment of a filtering unit of this invention.
Figure 4B:
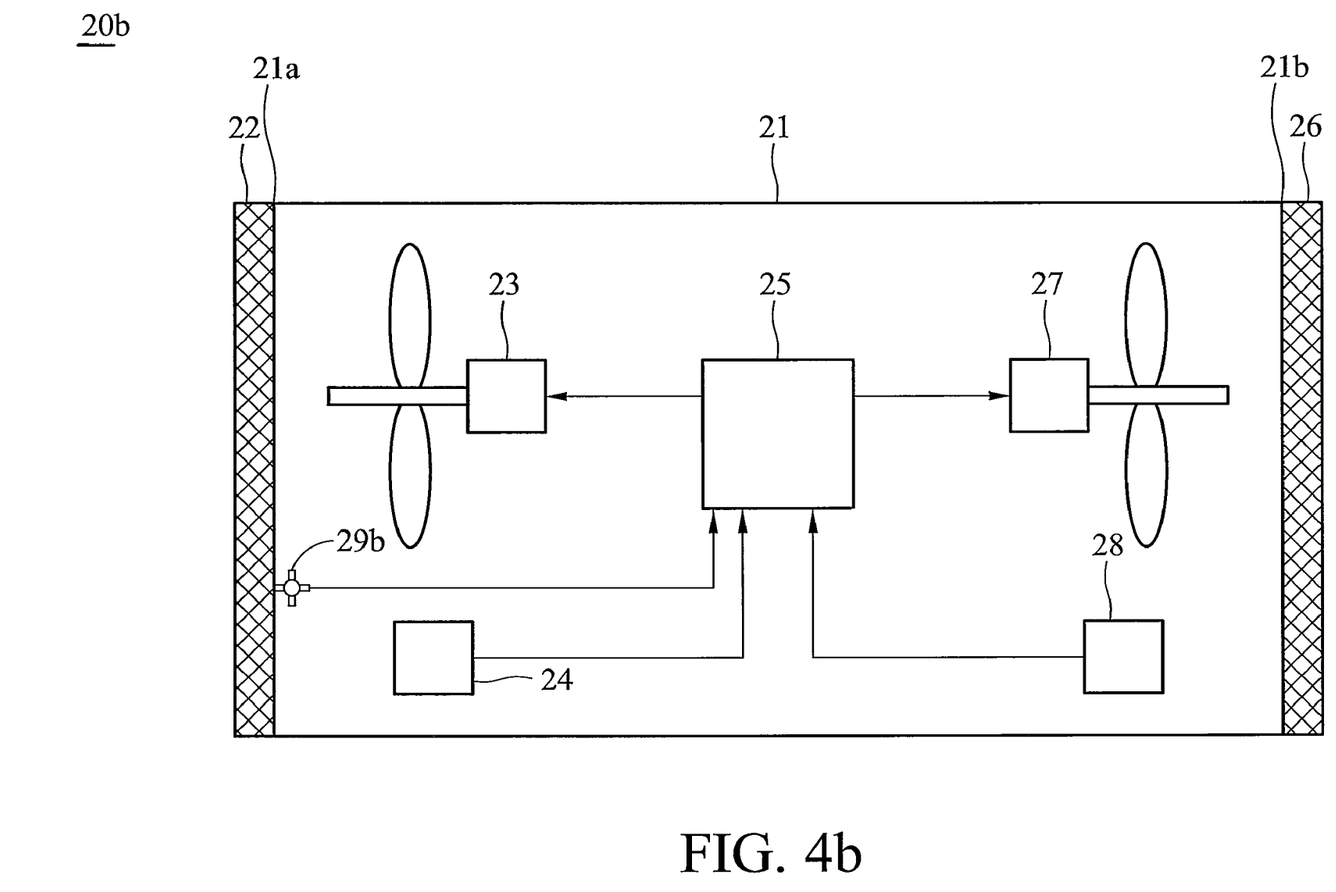
FIG. 4b is a schematic view of another embodiment of a filtering unit of this invention.

FIGS. 4a and 4b are schematic views of other embodiments of filtering units of the invention. Referring to FIG. 4a, a filtering unit 20a comprises a vibrator (cleaning device) 29a disposed on the first filter 22 and coupled to the controller 25. When the number of the particles P in the first filter 22 exceeds the threshold value, the controller 25 actuates the vibrator 29a to remove the particles P in the first filter 22. Alternatively, referring to FIG. 4b, a filtering unit 20b comprises a rotating member 29b coupled to the controller 25. When the number of the particles P in the first filter 22 exceeds the threshold value, the controller 25 actuates the rotating member 29b to rotate and strike the first filter 22 to remove the particles P in the first filter 22. By way of the vibrator or the rotating member, the filter may be more thoroughly cleaned.

Note that in the filtering units 20a and 20b, the vibrator 29a or the rotating member 29b may be actuated by the controller 25 while the rotating direction of the fan is changed. However, it is not limited to this. Conversely, when the vibrator 29a or the rotating member 29b is actuated, the rotating direction of the fan may remain the same.

Additionally, in the described embodiments, the electronic device is received in the filtering unit; however, it is not limited to this. The design concept of the filtering unit may be integrated into the electronic device. For example, a projector may comprise a housing, a filter, a fan (or a cleaning device), a detector, and a controller. Furthermore, the controller may be integrated into a circuit board of the projector.

As previously described, the filtering unit comprises a self-cleaning filter, thus, the life of the filter can be increased.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A filtering unit, comprising:
a housing comprising an inlet and an exit;
a first filter disposed at the inlet of the housing;
a second filter disposed at the exit of the housing;
a first fan disposed in the housing;
a second fan disposed in the housing;
a first detector configured to detect the presence of particles in the first filter;
a second detector configured to detect the presence of particles in the second filter; and
a controller coupled to the first and second fans and to the first and second detectors, wherein when the first detector detects that a predetermined volume of particles is present in the first filter the first detector outputs a signal to the controller to change the rotating direction of at least one of the first and second fans, and wherein when the second detector detects that a predetermined volume of particles is present in the second filter the second detector outputs a signal to the controller to change the rotating direction of at least one of the first and second fans.

2. The filtering unit of claim 1 wherein at least one of the first or second filters comprises a first side and a second side, and at least one of the first or second detectors comprises:
a light emitter disposed adjacent to the first side of the first filter; and a receiver disposed adjacent to the second side of the first filter configured to receive light from the light emitter.

3. The filtering unit of claim 2, wherein the light emitter comprises a light emitting diode, and the receiver comprises an optical switch.

4. The filtering unit of claim 1, wherein the first filter comprises a first side and a second side, and at least one of the first or second detectors comprises:
- a light emitter disposed adjacent to the first side of the at least one of the first or second filter;
- a reflector disposed adjacent to the second side of the at least one of the first or second filter, wherein light is emitted onto the reflector; and
- a receiver disposed adjacent to the first side of the at least one of the first and second filter, the receiver being configured to receive the light from the reflector.

5. The filtering unit of claim 1, further comprising a vibrator disposed on at least one of the first or second filters and coupled to the controller, wherein when the predetermined volume of particles is present in the at least one of the first or second filter, the controller actuates the vibrator to remove the particles in the first filter.

6. The filtering unit of claim 1, further comprising a rotating member coupled to the controller, wherein when the predetermined volume of particles is present in at least one of the first or second filters the controller actuates the rotating member to rotate and strike the at least one of the first or second filter to remove the particles.

7. The filtering unit of claim 1 wherein the controller is configured to alternate the rotating direction of the first and second fans according to the detected presence of particles in at least one of the first or the second filters.

8. The filtering unit of claim 1 wherein the controller is configured to prevent the first and second fans from simultaneously rotating in opposite directions.

9. The filtering unit of claim 1 wherein the controller is configured to stop rotation of at least one of the first or the second fan according to the detected presence of particles in at least one of the first or the second filters.

10. A filtering unit, comprising:
- a housing comprising an air inlet;
- an air filter positioned at the air inlet, wherein the air filter comprises a first side and a second side;
- a fan positioned in the housing and configured to rotate alternatively in a first direction and a second direction, the first direction being opposite the second direction;
- a vibration device positioned at the air inlet;
- a detector configured to detect a presence of particles in the filter, wherein the detector comprises a light emitter positioned adjacent to the first side of the air filter and a receiver positioned adjacent to the second side of the air filter, the air filter being configured to receive light from the light emitter; and
- a controller coupled to the vibration device and the detector, wherein when a volume of particles in the filter exceeds a threshold value the detector outputs a signal to the controller to instruct the fan to change a rotation direction from the first direction to the second direction, and to actuate the vibration device to shake particles out of the filter; wherein the air filter extends continuously across the light emitted from the light emitter.

11. The filtering unit of claim 10 wherein the light emitter comprises a light emitting diode, and the receiver comprises an optical switch.

12. The filtering unit of claim 10, further comprising a rotating member that rotates and strikes the filter at a first location of the filter to remove particles from at least a second location of the filter when the controller actuates the rotating member.

13. The filtering unit of claim 12 wherein the rotating member comprises a plurality of arms that rotate about an axis, the arms being configured to strike the filter to remove particles from the filter.

14. An electronic device comprising:
- a housing comprising an inlet and an outlet;
- a first filter disposed at the inlet of the housing;
- a second filter disposed at the outlet of the housing;
- a first fan disposed in the housing;
- a second fan disposed in the housing;
- a first detector configured to detect particles in the first filter;
- a second detector configured to detect particles in the second filter; and
- a circuit board comprising a controller coupled to the first and the second detectors, the first and second detectors being configured to output a signal to the controller to stop rotation of at least one of the first or the second fan after the first or the second detector detects a predetermined quantity of particles in at least one of the first or second filters.

15. The electronic device of claim 14 wherein at least one of the first or second filters comprises a first side and a second side, and at least one of the first or the second detectors comprises:
- a light emitter disposed adjacent to the first side of the at least one of the first or the second filter; and
- a receiver disposed adjacent to the second side of the at least one of the first or the second filter, the receiver being configured to receive light from the light emitter.

16. The electronic device of claim 14 wherein at least one of the first or the second filters comprises a first side and a second side, and at least one of the first or the second detectors comprises:
- a light source disposed adjacent to the first side of the at least one of the first or the second filter;
- a reflector disposed adjacent to the second side of the at least one of the first or the second filter, at least a portion of the reflector being exposed to the light source; and
- a receiver disposed adjacent to the first side of the at least one of the first or the second filter, the receiver being configured to receive light reflected from the reflector.

17. The electronic device of claim 14, further comprising a vibrator disposed on at least one of the first or the second filters and coupled to the controller, wherein the controller is configured to actuate the vibrator to remove the particles from at least one of the first or the second filters.

18. The electronic device of claim 14, further comprising a rotating member coupled to the controller, wherein the controller is configured to actuate the rotating member to rotate and strike at least one of the first or the second filters to remove the particles from at least one of the first or the second filters.

19. The electronic device as claimed in claim 14 wherein the electronic device comprises a projector.

20. A filtering unit, comprising:
- a housing comprising an air inlet;
- an air filter positioned at the air inlet and extending in a plane;
- a fan positioned in the housing, the fan being configured to rotate in a first direction about a rotational axis to draw air into the inlet in a direction generally transverse to the plane, and in a second direction about the rotational axis to force air from the air inlet, wherein the rotational axis is generally transverse to the plane;

a rotation device positioned at the air inlet;

a detector configured to detect a presence of particles in the filter by receiving light from a light emitter; and a controller coupled to the rotation device, the fan, and the detector, wherein when a predetermined volume of particles in the filter exceeds a threshold value, the detector outputs a signal to the controller to instruct the controller to alternate the direction of the fan and to actuate the rotation device to strike the filter at a first location of the filter to remove particles from at least a second location of the filter, and wherein the light from the light emitter passes through the air filter in a direction generally transverse to the plane.

21. The filtering unit of claim 20 wherein the filter comprises a first side and a second side, and wherein the light emitter is positioned adjacent to the first side of the filter, and the detector further comprises:

a receiver positioned adjacent to the second side of the filter, wherein the receiver is configured to receive light from the light emitter.

22. The filtering unit of claim 20 wherein the filter comprises a first side and a second side, and wherein the light emitter is positioned adjacent to the first side of the filter, and the detector further comprises:

a reflector positioned adjacent to the second side of the filter, wherein the light emitter is configured to emit light onto the reflector; and a receiver positioned adjacent to the first side of the filter, the receiver being configured to receive the light from the reflector such that the volume of particles in the filter can be measured by measuring the amount of light that reaches the receiver.

23. A filtering unit, comprising:

an air filter positioned near an air inlet, the air filter extending in a plane;

a fan configured to rotate in a first direction about a rotational axis to draw air into the inlet and in a second direction about the rotational axis to force air from the air inlet, wherein the rotational axis is generally transverse to the plane;

a rotation device positioned at the air inlet;

a detector configured to detect a presence of particles in the filter by receiving light from a light emitter, the light emitter being configured to emit light in a direction generally parallel to the rotational axis through the air filter; and a controller coupled to the rotation device, the fan, and the detector, wherein when a predetermined volume of particles in the filter exceeds a threshold value, the detector outputs a signal to the controller to instruct the controller to alternate the direction of the fan and to actuate the rotation device to strike the filter at a first location of the filter to remove particles from at least a second location of the filter.

24. The filtering unit of claim 23 wherein the rotational axis is normal to the plane.

25. The filtering unit of claim 23 wherein the air filter is generally planar.

* * * * *